(12) United States Patent
Wu

(10) Patent No.: US 9,673,426 B2
(45) Date of Patent: Jun. 6, 2017

(54) MASK PLATE FOR COATING GLASS CEMENT AND COATING METHOD USING THE SAME

(71) Applicants: BOE TECHNOLOGY GROUP CO., LTD., Beijing (CN); ORDOS YUANSHENG OPTOELECTRONICS CO., LTD., Inner Mongolia Autonomous Region (CN)

(72) Inventor: Haidong Wu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia Autonomous Region (CN)

(*) Notice: Subject to any disclaimer, the term of this patent is extended or adjusted under 35 U.S.C. 154(b) by 0 days.

(21) Appl. No.: 14/889,106

(22) PCT Filed: Feb. 10, 2015

(86) PCT No.: PCT/CN2015/072645
§ 371 (c)(1),
(2) Date: Nov. 4, 2015

(87) PCT Pub. No.: WO2016/074361
PCT Pub. Date: May 19, 2016

(65) Prior Publication Data
US 2016/0359146 A1    Dec. 8, 2016

(30) Foreign Application Priority Data

Nov. 10, 2014   (CN) .......................... 2014 1 0643443

(51) Int. Cl.
*H01L 51/56*   (2006.01)
*H01L 51/52*   (2006.01)
*H01L 21/033*   (2006.01)

(52) U.S. Cl.
CPC ............ *H01L 51/56* (2013.01); *H01L 21/033* (2013.01); *H01L 51/524* (2013.01); *H01L 51/5253* (2013.01); *H01L 2924/0002* (2013.01)

(58) Field of Classification Search
CPC ..... H01L 51/5246; H01L 51/56; H01L 23/31; H01L 21/033; H01L 2924/0002; B05B 15/045; Y10T 29/49826; B05C 21/005
(Continued)

(56) References Cited

U.S. PATENT DOCUMENTS 5,887,520 A  *  3/1999  Kinoshita ................. B41C 1/14
                                                       101/128.4
2004/0261636 A1   12/2004  Fleck et al.
2014/0338597 A1 *  11/2014  Li ......................... B05B 15/045
                                                       118/504

FOREIGN PATENT DOCUMENTS

CN    101140364 A    3/2008
CN    101872119 A    10/2010
(Continued)

OTHER PUBLICATIONS

First Office Action regarding Chinese application No. 201410643443.2, dated Aug. 10, 2016. Translation provided by Dragon Intellectual Property Law Firm.
(Continued)

*Primary Examiner* — Thomas L Dickey
*Assistant Examiner* — Changhyun Yi
(74) *Attorney, Agent, or Firm* — Harness, Dickey & Pierce, P.L.C.

(57) ABSTRACT

A mask plate for coating glass cement is provided. The mask plate includes a channel penetrating through a first surface and a second surface for allowing the glass cement to pass therethrough. The channel extends through the first surface and the second surface to form a predetermined pattern. A first opening of the channel at the first surface is of a width greater than a second opening of the channel at the second surface.

20 Claims, 6 Drawing Sheets

(58) Field of Classification Search
USPC .............................. 29/428; 438/26; 257/678
See application file for complete search history.

(56) References Cited

FOREIGN PATENT DOCUMENTS

| CN | 103208508 A | 7/2013 |
|---|---|---|
| CN | 103864009 A | 6/2014 |
| CN | 104332450 A | 2/2015 |
| CN | 204167291 U | 2/2015 |
| JP | H09-123629 A | 5/1997 |
| KR | 10-0900681 B1 | 6/2009 |

OTHER PUBLICATIONS

Written Opinion of the International Searching Authority for international application No. PCT/CN2015/072645.
Second Office Action regarding Chinese Application No. 201410643443.2, dated Apr. 1, 2017. Translation provided by Dragon Intellectual Property Law Firm.

\* cited by examiner

MASK PLATE FOR COATING GLASS CEMENT AND COATING METHOD USING THE SAME

CROSS-REFERENCE TO RELATED APPLICATION

The present application is the U.S. national phase of PCT Application No. PCT/CN2015/072645 filed on Feb. 10, 2015, which claims a priority of the Chinese patent application No. 201410643443.2 filed on Nov. 10, 2014, which is incorporated herein by reference in its entirety.

TECHNICAL FIELD

The present disclosure relates to the field of display packaging technology, in particular to a mask plate for coating glass cement and a coating method using the mask plate.

BACKGROUND

A glass cement coating process is indispensable for packaging an organic light-emitting diode (OLED).

Referring to FIGS. 1a and 1b, which are a planar view and a sectional view of a mask plate used in an existing OLED packaging process, respectively, the mask plate 1 for coating glass cement includes a plurality of channel regions 2 through which the glass cement passes, and a shielding region. A region surrounded by the channel regions 2 is of a shape and a size identical to those of a display region of a display panel.

Referring to FIGS. 2a and 2b, during the packaging, it is required to enable the glass cement to pass through the channel regions 2 of the mask plate 1 and then transferred onto a glass substrate 3. However, when the existing mask plate is used to coat, at an inappropriate speed, the glass cement 4 onto the glass substrate 3, gaps or bubbles may easily occur. As a result, a packaging effect will be deteriorated, the resistance of the packaged display device to water and oxygen will be reduced, and finally a service life of electronic elements in the display device will be shortened.

SUMMARY

An object of the present disclosure is to provide a mask plate for coating glass cement, and a coating method using the mask plate, so as to prevent the occurrence of gaps and bubbles.

In one aspect, the present disclosure provides in one embodiment a mask plate for coating glass cement, including a channel penetrating through a first surface and a second surface for allowing the glass cement to pass therethrough. The channel extends through the first surface and the second surface to form a predetermined pattern. An opening of the channel at the first surface is of a width greater than an opening of the channel at the second surface.

Alternatively, inner walls at both sides of the channel each have a planar surface angled at about 40° to 50° relative to the second surface.

Alternatively, the inner walls at both sides of the channel each have a curved surface, the curved surface is an arc surface having a predetermined curvature, and a tangent plane of the curved surface is angled at about 40° to 50° relative to the second surface.

Alternatively, the inner walls at both sides of the channel each have a curved surface, and the curved surface includes a first planar portion angled relative to the second surface and a second planar portion perpendicular to the second surface.

Alternatively, grid-like metal wires or polymer wires are arranged inside the channel.

Alternatively, the polymer wire is made of Nylon or polyethylene terephthalate (PET).

Alternatively, the grid-like metal wire or polymer wire is of an aperture size of 30 μm to 50 μm.

Alternatively, the predetermined pattern is of a shape identical to a display region of a display panel to be packaged.

Alternatively, a plurality of channels having the predetermined pattern is formed on the mask plate.

Alternatively, the predetermined pattern is of a rectangular shape, and the channel includes a first portion extending in a first extension direction and a second portion extending in a second extension direction perpendicular to the first extension direction.

Alternatively, the openings of the channel at the first surface and the second surface have widths each of a constant value in the extension directions.

In another aspect, the present disclosure provides in one embodiment a method for coating glass cement using the above-mentioned mask plate, including steps of: placing the mask plate onto a glass substrate in such a manner that a second surface of the mask plate is adhered to the glass substrate and a channel having a predetermined pattern is aligned with an edge of a region of the glass substrate to be coated; pushing, by a scraper, the glass cement at a first surface to move in a direction parallel to the first surface, so as to fill the glass cement into the channel; and separating the mask plate from the glass substrate in a direction perpendicular to the glass substrate, with the glass cement inside the channel being partially left on the glass substrate.

According to the embodiments of the present disclosure, the opening of the channel at the first surface is of a width greater than the opening of the channel at the second surface, and when a surface of the mask plate where the opening of the channel is smaller is adhered onto the glass substrate and the glass cement is injected through the larger opening, it is able to fill up the narrower portion of the channel with the glass cement in an easier manner as compared to the existing mask plate where the channel is of an identical width. As a result, it is able to prevent the occurrence of bubbles or gaps in the channel, and to coat the glass cement evenly.

DETAILED DESCRIPTION

In order to make the objects, the technical solutions and the advantages of the present disclosure more apparent, the present disclosure will be described hereinafter in conjunction with the drawings and embodiments.

Figure 3:
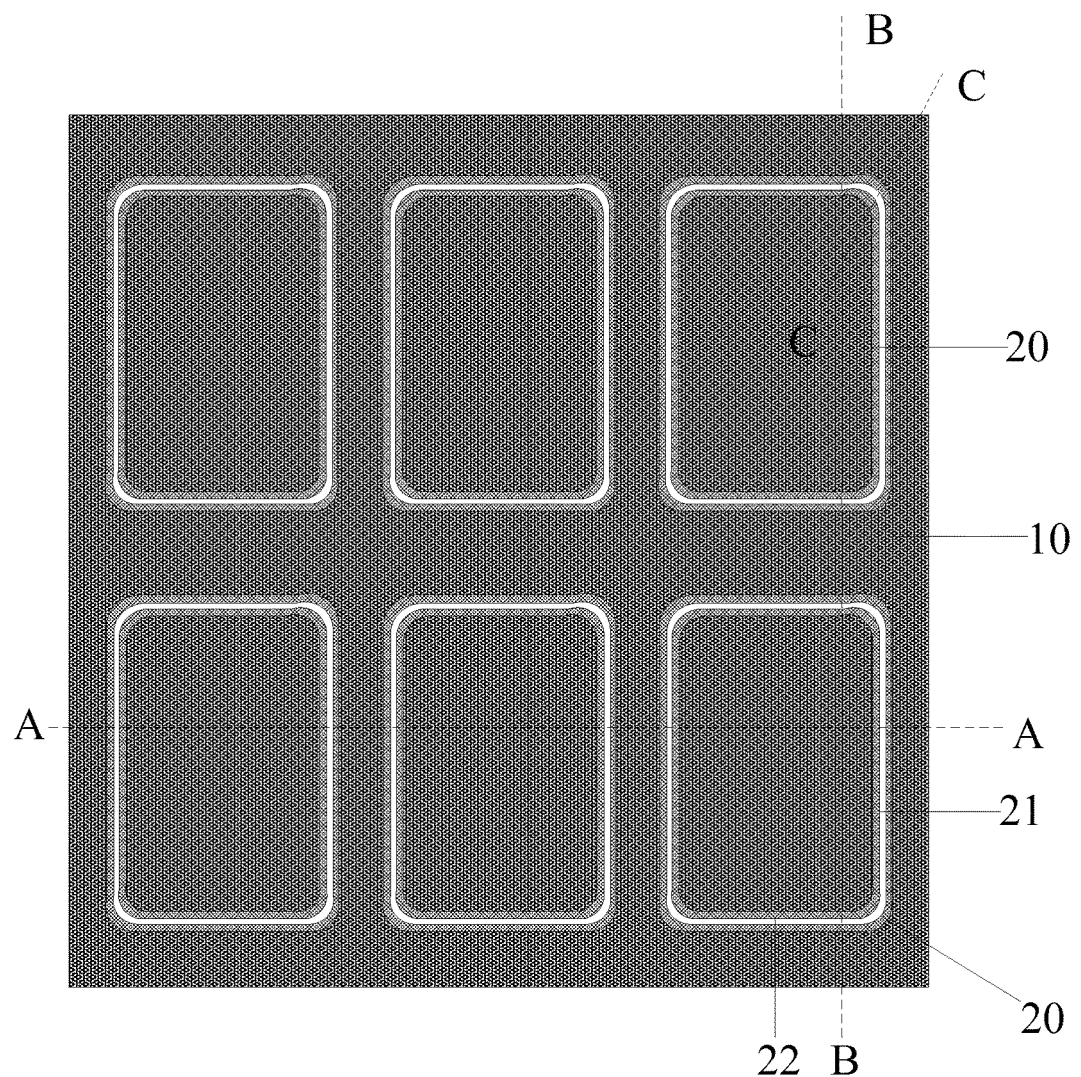
FIG. 3 is a planar view of a mask plate according to the first embodiment of the present disclosure.
Figure 4:
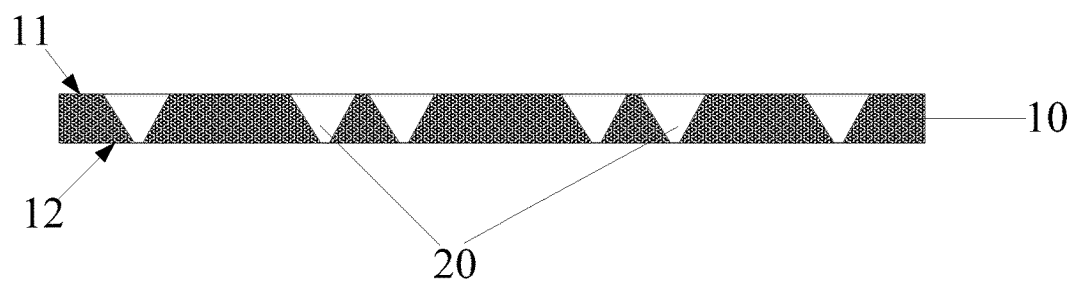
FIG. 4 is a sectional view of the mask plate according to the first embodiment of the present disclosure.

Referring to FIG. 3 which is a planar view of a mask plate according to the first embodiment of the present disclosure and FIG. 4 which is a sectional view of the mask plate according to the first embodiment of the present disclosure, the mask plate 10 includes a channel 20 penetrating through a first surface 11 and a second surface 12 for allowing glass cement to pass therethrough. The channel 20 extends through the first surface 11 and the second surface 12 to form a predetermined pattern. An opening of the channel 20 at the first surface 11 is of a width greater than an opening of the channel 20 at the second surface 12.

According to this embodiment, the opening of the channel at the first surface is of a width greater than the opening of the channel at the second surface, and when a surface of the mask plate where the opening of the channel is smaller is adhered onto a glass substrate and the glass cement is injected through the larger opening, it is able to fill up the narrower portion of the channel with the glass cement in an easier manner as compared to an existing mask plate where the channel is of an identical width. As a result, it is able to prevent the occurrence of bubbles or gaps in the channel, and to coat the glass cement evenly.

Alternatively, the width of the opening of the channel 20 at the first surface 11 is of a first constant value, and the width of the opening of the channel 20 at the second surface 12 is of a second constant value less than the first constant value.

In addition, the widths of the openings of the channel 20 at the first surface 11 and the second surface 12 may not be of a constant value, but the width of the opening of the channel 20 at each position on the first surface 11 is greater than the width of the opening at a corresponding position on the second surface 12.

The width of the opening of the channel 20 at a position on the first surface 11 refers to a distance between two side walls of the opening of the channel 20 at the first surface 11 as viewed from a section perpendicular to an extension direction of the channel 20, and the width of the opening of the channel 20 at a position on the second surface 12 refers to a distance between two side walls of the opening of the channel 20 at the second surface 12 as viewed from the section perpendicular to the extension direction of the channel 20. It should be appreciated that, the extension direction refers to a direction in which the channel extends through the first surface and the second surface to form the predetermined pattern.

Figure 1A:
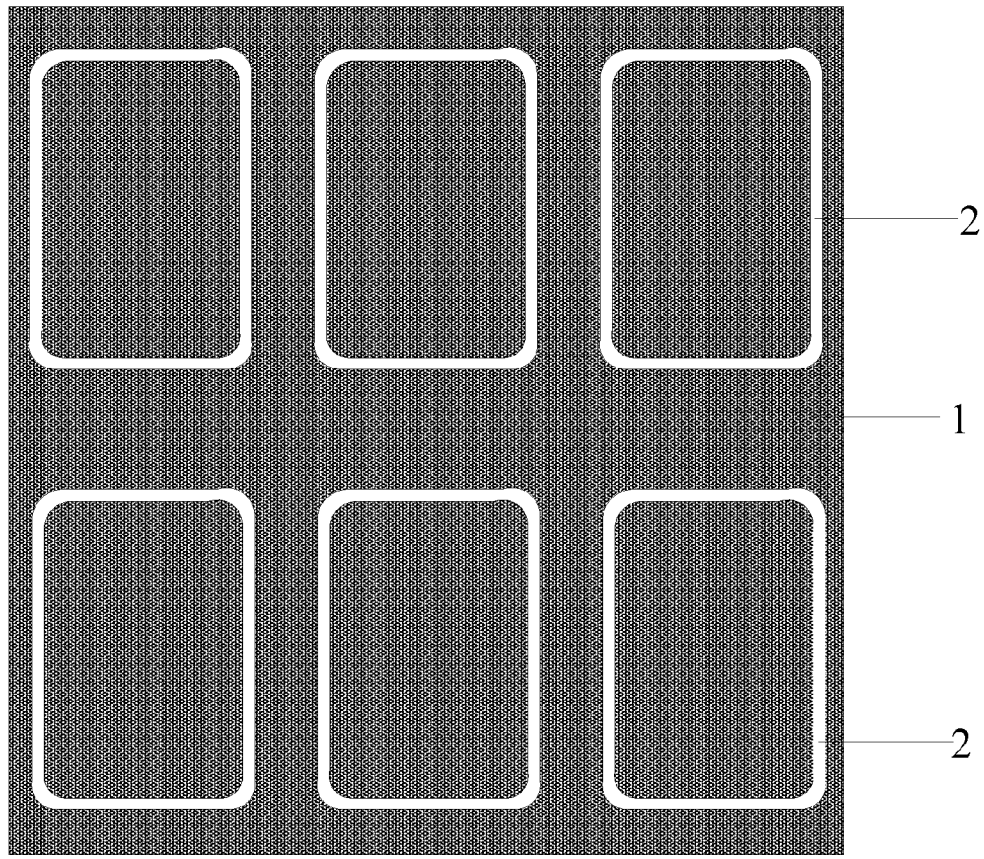
FIG. 1a is a planar view of an existing mask plate for packaging an OLED.
Figure 1B:
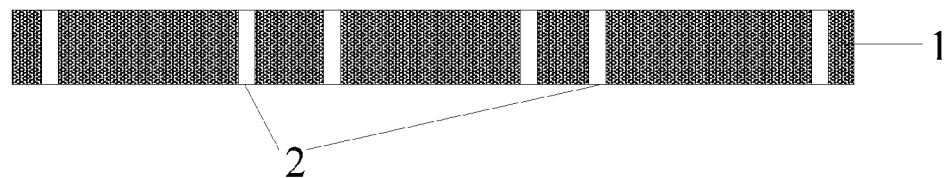
FIG. 1b is a sectional view of the existing mask plate for packaging the OLED.
Figure 2A:
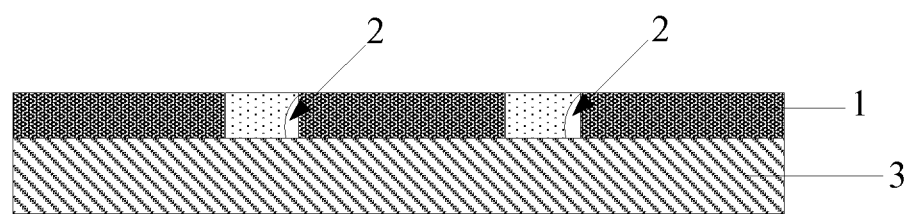
FIG. 2a is a schematic view showing an existing process for coating glass cement.
Figure 2B:
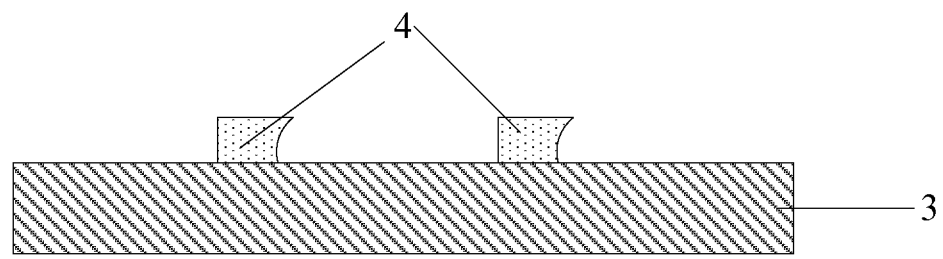
FIG. 2b is a schematic view showing the glass cement coated onto a glass substrate using the existing mask plate.

To be specific, as shown in FIG. 4, inner walls at both sides of the channel each have a planar surface, i.e., a section of the channel 20 is of an inverted trapezoidal shape as shown in FIG. 4 as viewed from the section perpendicular to the extension direction of the channel 20. When a surface of the mask plate where the opening of the channel 20 is smaller is adhered onto a glass substrate and the glass cement is injected through the larger opening, the opening at the surface adhered onto the glass substrate is smaller and the inclined planar surface may facilitate the sliding-down of the glass cement, so it is able to fill up the narrower portion of the channel 20 with the glass cement in an easier manner as compared to the existing mask plate as shown in FIG. 1b. As a result, it is able to prevent the occurrence of bubbles or gaps in the channel, and to coat the glass cement evenly.

It should be appreciated that, the region other than the channel 20 on the mask plate 10 is a shielding region, and when coating the glass cement, the glass cement may merely pass through the channel 20.

Referring to FIG. 4 again, in order to ensure that the glass cement is coated evenly, the planar surface of each inner wall of the channel 20 is angled at about 40° to 50° relative to the second surface 12.

In addition, the predetermined patterns of the channel 20 at the first surface 11 and the second surface 20 are each of a shape identical to a display region of a display panel to be packaged. As shown in FIG. 3, a plurality of channels 20 having the predetermined pattern is formed on the mask plate 10. Usually, the display region of the display panel is of a rectangular shape, so the predetermined pattern is also of a rectangular shape, and two adjacent sides of the rectangle are connected with an arc. Based on the shape of the predetermined pattern, the channel 20 includes a first portion 21 extending in a first extension direction and a second portion 22 extending in a second extension direction perpendicular to the first extension direction. Correspondingly, as viewed from a section A-A perpendicular to the first portion 21 and a section B-B perpendicular to the second portion 22, the channel 20 is of a shape as shown in FIG. 4. Identically, at the position where the arc is located, as viewed from a section C-C perpendicular to a tangent line of the arc, the channel 20 is also of a shape as shown in FIG. 4.

Figure 5:
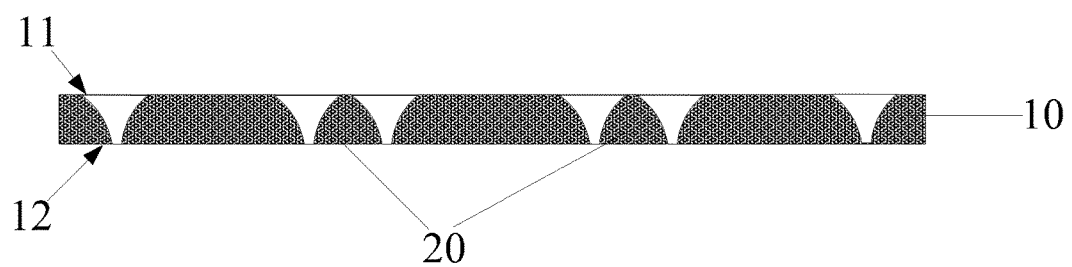
FIG. 5 is a sectional view of the mask plate according to the second embodiment of the present disclosure.

Referring to FIG. 5 which is a sectional view of the mask plate according to the second embodiment of the present disclosure, identical to the first embodiment, the mask plate 10 includes the channel 20 penetrating through the first surface 11 and the second surface 12, and the width of the opening of the channel 20 at the first surface 11 is greater than the width of the opening of the channel 20 at the second surface 12. However, different from the first embodiment, the inner walls at both sides of the channel 20 in the second embodiment are each of a curved surface, and this curved surface is of an arc shape having a predetermined curvature.

Alternatively, a tangent plane of the curved surface is angled at about 40° to 50° relative to the second surface 12. The tangent plane refers to a plane tangent to the curved surface at a point thereon. The way for calculating the tangent plane of the curved surface is known in the art, and thus it will not be particularly defined herein.

In this way, it is also able to prevent the occurrence of gaps or bubbles inside the channel 20, and to coat the glass cement evenly.

Figure 6:
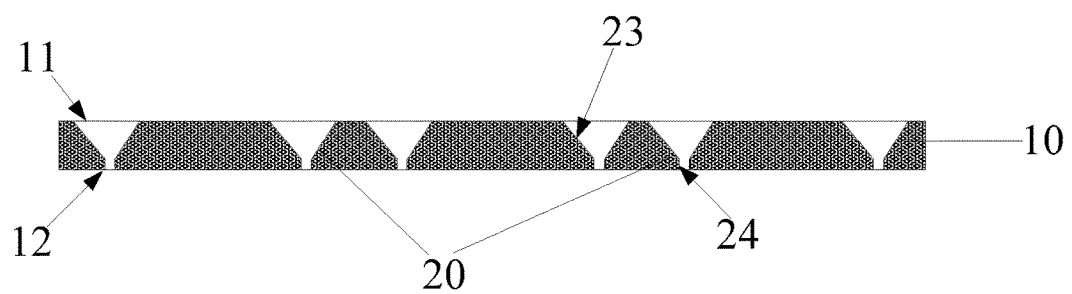
FIG. 6 is a sectional view of the mask plate according to the third embodiment of the present disclosure.

Referring to FIG. 6 which is a sectional view of the mask plate according to the third embodiment, identical to the second embodiment, the inner walls of the channel 20 are each of a curved surface, but the curved surface in the third embodiment is of a different shape. In this embodiment, the curved surface of the channel 20 includes a first planar portion 23 angled relative to the second surface 12 and a second planar portion 24 perpendicular to the second surface 12, and the first planar portion 23 is further away from the second surface 12 than the second planar portion 24.

Alternatively, the first planar portion 23 is angled at about 40° to 50° relative to the second surface 12.

Identical to the first embodiment, when a surface of the mask plate in the third embodiment where the opening of the channel 20 is smaller is adhered onto the glass substrate, it is able to fill up the narrower portion of the channel with the glass cement in an easier manner as compared to the existing mask plate where the channel is of an identical width. As a result, it is able to prevent the occurrence of bubbles or gaps in the channel, and to coat the glass cement evenly.

Figure 7:
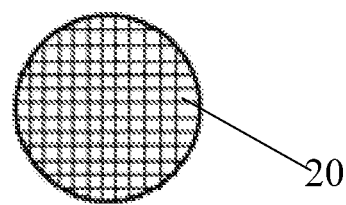
FIG. 7 is a schematic view showing a channel according to one embodiment of the present disclosure.

The mask plate according to the first, second or third embodiment of the present disclosure may be woven by polymer or metal wires, and typically, the grid-like metal or poly wires may be arranged inside the channel on the mask plate. The polymer wire is made of Nylon or PET. Typically, the grid-like metal wire or polymer wire is of an aperture size of about 30 to 50 μm. As shown in FIG. 7, when the glass cement is coated with this structure, it is able to achieve an effect like "screen printing".

Figure 8A:
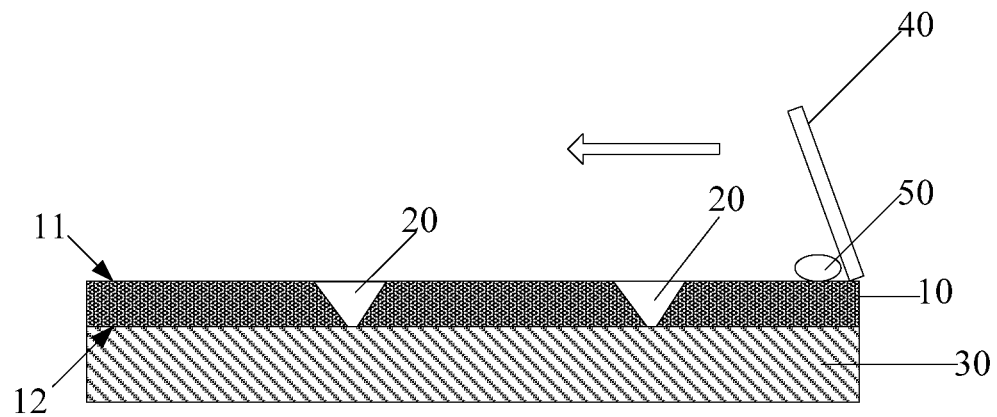
FIGS. 8a to 8c are schematic views showing a process for coating the glass cement using the mask plate according to one embodiment of the present disclosure.
Figure 8B:
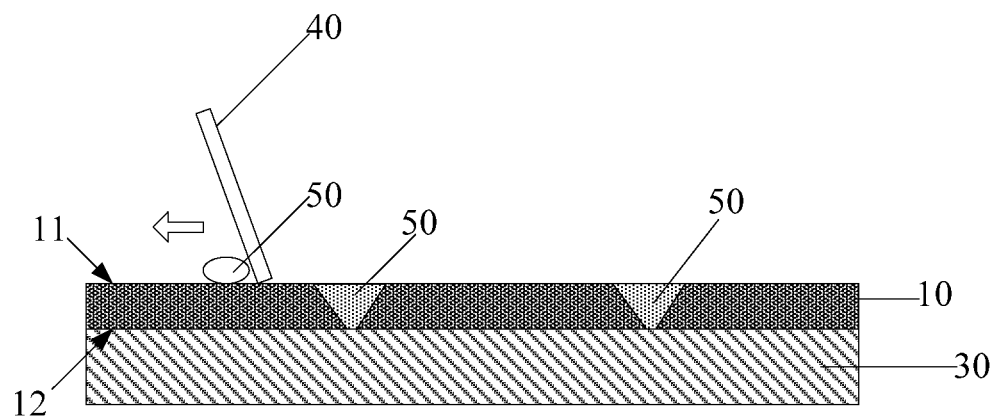
Figure 8C:
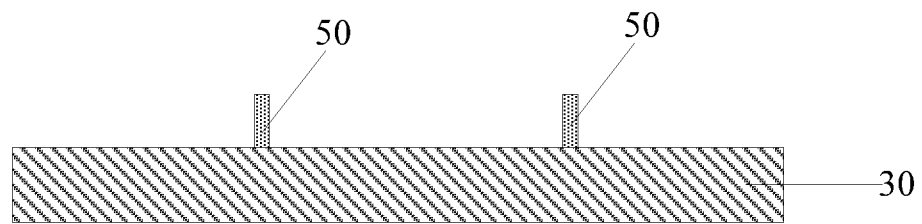

The present disclosure further provides in one embodiment a method for coating the glass cement using the above-mentioned mask plate. Taking the mask plate in the first embodiment as an example, the method, as shown in FIGS. 8a-8c, includes steps of: placing the mask plate 10 onto the glass substrate 30 in such a manner that the second surface 12 of the mask plate is adhered to the glass substrate 30 and the channel 20 having the predetermined pattern is aligned with an edge of the glass substrate 30 to be coated; pushing, by a scraper 40, the glass cement at the first surface 11 to move in a direction parallel to the first surface 11, so as to fill the glass cement into the channel 20; and separating the mask plate 10 from the glass substrate 30 in a direction perpendicular to the glass substrate 30, with the glass cement inside the channel 20 being partially left on the glass substrate 30.

To be specific, the glass cement left on the glass substrate 30 is of a width equal to the width of the opening of the channel at the second surface. This is because, when the mask plate 10 is separated from the glass substrate 30 in a direction perpendicular to the glass substrate 30, due to the inclined inner walls of the channel 20, merely the glass cement above the opening at the second surface is left on the glass substrate 30, so as to form a regular structure and meet the requirements of coating the glass cement for the display panel.

According to the above-mentioned method for coating the glass cement using the mask plate, it is able to prevent the occurrence of gaps or bubbles inside the channel, and to coat the glass cement evenly.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A mask plate for coating glass cement, comprising a channel penetrating through a first surface and a second surface for allowing the glass cement to pass therethrough, the channel extending through the first surface and the second surface to form a predetermined pattern, wherein a first opening of the channel at the first surface is of a width greater than a second opening of the channel at the second surface.

2. The mask plate according to claim 1, wherein inner walls at both sides of the channel each have a planar surface angled at about 40° to 50° relative to the second surface.

3. The mask plate according to claim 2, wherein grid-like metal wires or polymer wires are arranged inside the channel.

4. The mask plate according to claim 2, wherein the predetermined pattern is of a shape identical to a display region of a display panel to be packaged.

5. The mask plate according to claim 2, wherein a plurality of channels having the predetermined pattern is formed on the mask plate.

6. The mask plate according to claim 2, wherein the predetermined pattern is of a rectangular shape, and the channel comprises a first portion extending in a first extension direction and a second portion extending in a second extension direction perpendicular to the first extension direction.

7. The mask plate according to claim 2, wherein the first opening at the first surface and the second opening at the second surface of the channel have widths each of a constant value in the extension directions.

8. The mask plate according to claim 1, wherein the inner walls at both sides of the channel each have a curved surface, the curved surface is an arc surface having a predetermined curvature, and a tangent plane of the curved surface is angled at about 40° to 50° relative to the second surface.

9. The mask plate according to claim 8, wherein grid-like metal wires or polymer wires are arranged inside the channel.

10. The mask plate according to claim 1, wherein the inner walls at both sides of the channel each have a curved surface, and the curved surface comprises a first planar portion angled relative to the second surface and a second planar portion perpendicular to the second surface.

11. The mask plate according to claim 10, wherein grid-like metal wires or polymer wires are arranged inside the channel.

12. The mask plate according to claim 1, wherein grid-like metal wires or polymer wires are arranged inside the channel.

13. The mask plate according to claim 12, wherein the polymer wire is made of Nylon or polyethylene terephthalate (PET).

14. The mask plate according to claim 13, wherein the grid-like metal wire or polymer wire is of an aperture size of about 30 μm to 50 μm.

15. The mask plate according to claim 12, wherein the grid-like metal wire or polymer wire is of an aperture size of about 30 μm to 50 μm.

16. The mask plate according to claim 1, wherein the predetermined pattern is of a shape identical to a display region of a display panel to be packaged.

17. The mask plate according to claim 1, wherein a plurality of channels having the predetermined pattern is formed on the mask plate.

18. The mask plate according to claim 1, wherein the predetermined pattern is of a rectangular shape, and the channel comprises a first portion extending in a first extension direction and a second portion extending in a second extension direction perpendicular to the first extension direction.

19. The mask plate according to claim 1, wherein the first opening at the first surface and the second opening at the second surface of the channel have widths each of a constant value in the extension directions.

20. A method for coating glass cement using the mask plate according to claim 1, comprising steps of:
placing the mask plate onto a glass substrate in such a manner that a second surface of the mask plate is adhered to the glass substrate and a channel having a predetermined pattern is aligned with an edge of a region of the glass substrate to be coated;

pushing, by a scraper, the glass cement at a first surface to move in a direction parallel to the first surface, so as to fill the glass cement into the channel; and separating the mask plate from the glass substrate in a direction perpendicular to the glass substrate, with the glass cement inside the channel being partially left on the glass substrate.

* * * * *